(12) United States Patent
Chopra et al.

(10) Patent No.: US 7,047,510 B1
(45) Date of Patent: May 16, 2006

(54) METHOD AND SYSTEM FOR PARTITIONING AN INTEGRATED CIRCUIT DESIGN

(75) Inventors: Manu Chopra, New Delhi (IN); Xiaoqun Du, New Providence, NJ (US); Ronald H. Hardin, Pataskala, OH (US); Alok Jain, New Delhi (IN); Robert P. Kurshan, New York, NY (US); Pratik Mahajan, New Delhi (IN); Ravi Prakash, Noida (IN); Kavita Ravi, Chatham, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/422,535

(22) Filed: Apr. 23, 2003

(51) Int. Cl.
G06F 17/50 (2006.01)
(52) U.S. Cl. ............... 716/7; 716/8; 716/9; 716/10
(58) Field of Classification Search ............ 716/1, 716/3, 5, 6, 7, 11, 18, 8, 9, 10
See application file for complete search history.

(56) References Cited

U.S. PATENT DOCUMENTS

| | | | | |
|---|---|---|---|---|
| 5,513,124 A | * | 4/1996 | Trimberger et al. | ........... 716/7 |
| 5,544,066 A | | 8/1996 | Rostoker et al. | |
| 5,754,826 A | | 5/1998 | Gamal et al. | |
| 5,778,216 A | | 7/1998 | Venkatesh | |
| 5,831,869 A | | 11/1998 | Ellis et al. | |
| 6,018,622 A | | 1/2000 | Lin et al. | |
| 6,212,669 B1 | * | 4/2001 | Jain | ............... 716/7 |
| 6,243,849 B1 | | 6/2001 | Singh et al. | |
| 6,249,902 B1 | | 6/2001 | Igusa et al. | |
| 6,317,863 B1 | | 11/2001 | Segal | |
| 6,324,540 B1 | * | 11/2001 | Khanna et al. | ............ 707/102 |
| 6,415,426 B1 | * | 7/2002 | Chang et al. | .................. 716/9 |
| 6,480,991 B1 | * | 11/2002 | Cho et al. | ....................... 716/8 |
| 6,493,863 B1 | * | 12/2002 | Hamada et al. | ............... 716/18 |
| 6,651,234 B1 | * | 11/2003 | Gupta et al. | ................... 716/7 |
| 2004/0015803 A1 | * | 1/2004 | Huang et al. | ................. 716/10 |

OTHER PUBLICATIONS

Sulimma et al., "Improving placement under the Constant delay model", Mar. 2002, Design, automation and test in Europe conference and Exhibitions, pp. 677-682.*

Marques-Silva et al., "Solving satisfiability in combinational circuits", Jul.-Aug. 2003, IEEE transactions on, vol.: 21, Issue: pp.: 505-516.*

(Continued)

*Primary Examiner*—A. M. Thompson
*Assistant Examiner*—Helen Rossoshek
(74) *Attorney, Agent, or Firm*—Bingham McCutchen LLP

(57) ABSTRACT

A method and system for verifying integrated circuit designs through partitioning. In an embodiment, a design is partitioned, then each partition is verified. In one embodiment, the design is partitioned at the granularity of modules. In another embodiment, the design is partitioned at the granularity of instances. In a third embodiment, instances are grouped together, subject to a weight threshold, so as to form possibly overlapping partitions of instances that are contiguous in the design hierarchy, with the purpose of avoiding, to the extent possible, false negatives. In a further embodiment, the design is partitioned to avoid redundant partitions. In an embodiment, model checking is applied to one or more local properties in each partition. In another embodiment, simulation is used to verify each partition.

26 Claims, 12 Drawing Sheets

OTHER PUBLICATIONS

IBM, "Timing-influenced layout design", Apr. 1986, IBM Technical Disclisure Bulletin, vol.: 28, Issue No.: 11, pp.: 4981-4987.*

Vannelli et al., "A Gomory-Hu cut tree representation of a netlist partitioning problem", Sep. 1990, Circuits and Systems, IEEE Transactions on , vol.: 37 , Issue: 9 , pp.: 1133-1139.*

Chen et al., "A hierarchical partitioning algorithm for VLSI designs", Sep. 17-20, 2003, SOC Conference, 2003. Proceedings. IEEE International [Systems-on-Chip], pp.: 265-266.*

Vannelli et al., "An efficient eigenvector-node interchange approach for finding netlists partitions", May 12-15, 1991, Custom Integrated Circuits Conference, 1991., Proceedings of the IEEE 1991 , pp.: 28.2/1-28.2/4.*

Gupta et al., "SAT-based image computation with application in reachability analysis", [retrieved on 20050-08-31] Retrieved form the Internet: <URL: http://www.bdd-portal.org/dagstuhl-ppt/gupta.pdf.*

Kurshan, Robert P., "Computer-Aided Verification of Coordinating Processes. The Automata Theoretic Approach", Princeton University Press, Princeton, NJ, 1994.

Venkatesh, S.V. "Hierarchical Timing-Driven Floorplanning and Place and Route Using a Timing Budgeter" *IEEE 1995 Custom Integrated Circuits Conference* (1995) pp. 469-472.

* cited by examiner

METHOD AND SYSTEM FOR PARTITIONING AN INTEGRATED CIRCUIT DESIGN

BACKGROUND AND SUMMARY

The present invention is related to verification of integrated circuit designs. More particularly, the present invention is directed to a method and system for verifying integrated circuit designs through partitioning.

Circuit designers and verification engineers use different methods to verify circuit designs. One common verification technique is simulation. Simulation dynamically verifies a design by monitoring behaviors of the design with respect to simulation test benches. Another verification technique is model checking. Model checking statically verifies properties of a design by analyzing the state space of the design and determining whether a property holds in all reachable states. The properties to verify may be global properties involving signals in widely separated parts of the design, or they may be more local properties that pertain only to single or small number of related modules in the design.

As used herein, the term "module" refers to any part of an integrated circuit design. A module may comprise, for example, one or more functional components or a part of each of one or more functional components. A module is generally parameterized and thus may be instantiated one or more times in an integrated circuit design to describe "instances" of that module. An integrated circuit design in this case is comprised of module instances.

There are two distinct classes of local properties: built-in and user-specified. The built-in properties are those that can be inferred from the structure of the design, for example, the absence of arithmetic overflow, range overflow, index overflow, bus contention, multi-driven bus, divide by zero, and combinational cycles. The user-specified properties are those that are explicitly provided by the user, for example, as synthesis pragmas or as assertions defined in assertion language.

Model checking has potential advantages over simulation. For example, no simulation test bench is required to run model checking. Moreover, model checking, unlike simulation, is exhaustive. On the other hand, model checking, due to computational limitations, generally cannot handle large designs. Hence, designs must often be partitioned into sufficiently small parts in order to model check a given property. Although presently capacity is not an issue for simulation of designs, it is foreseeable that in the future designs could be of a size that cannot be handled by a simulator as a whole.

Model checking is also sensitive to assumptions about the environment of the portion of the design being checked, and is prone to generating false negatives, i.e., reports of failures that cannot actually happen, if sufficient information about the environment is not included in the run. There may be an accuracy versus performance trade-off in different partitioning strategies. A partitioning strategy that generates the minimum number of computationally tractable non-overlapping partitions could be the most computationally efficient but could lead to a large number of false negatives. Consequently, there is a need for partitioning algorithms that provides a balance between accuracy and performance.

The present invention provides a method and system for verifying integrated circuit designs through partitioning. In an embodiment, a design is partitioned, then verification is applied to each partition. In one embodiment, the design is partitioned at the granularity of modules. In another embodiment, the design is partitioned at the granularity of instances. In a further embodiment, the design is partitioned to avoid redundant partitions. In an embodiment, model checking is applied to local properties of each partition. In another embodiment, simulation is used to verify each partition.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The accompanying drawings are included to provide a further understanding of the invention and, together with the Detailed Description, serve to explain the principles of the invention.

DETAILED DESCRIPTION

Figure 1A:
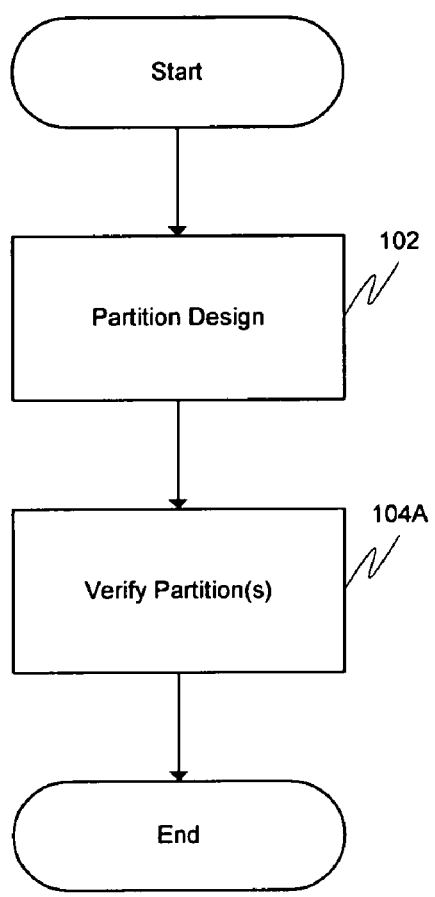
FIG. 1A depicts a high-level process flow chart of an embodiment of the present invention.

The present invention provides a method and system for verifying integrated circuit designs through partitioning. FIG. 1A depicts a high-level process flow chart for verifying an integrated circuit design according to an embodiment of the invention. The first step is to partition the design into one or more partitions (102). A partition is defined by taking a subset of the design and carving out the rest of the design by creating pseudo inputs for input ports in the partition.

Figure 4:
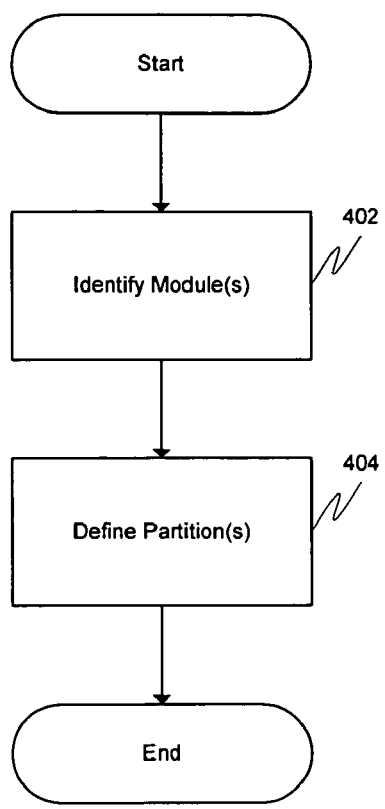
FIG. 4 is a flow diagram showing a process for partitioning an integrated circuit design at the granularity of modules according to an embodiment of the present invention.
Figure 10:
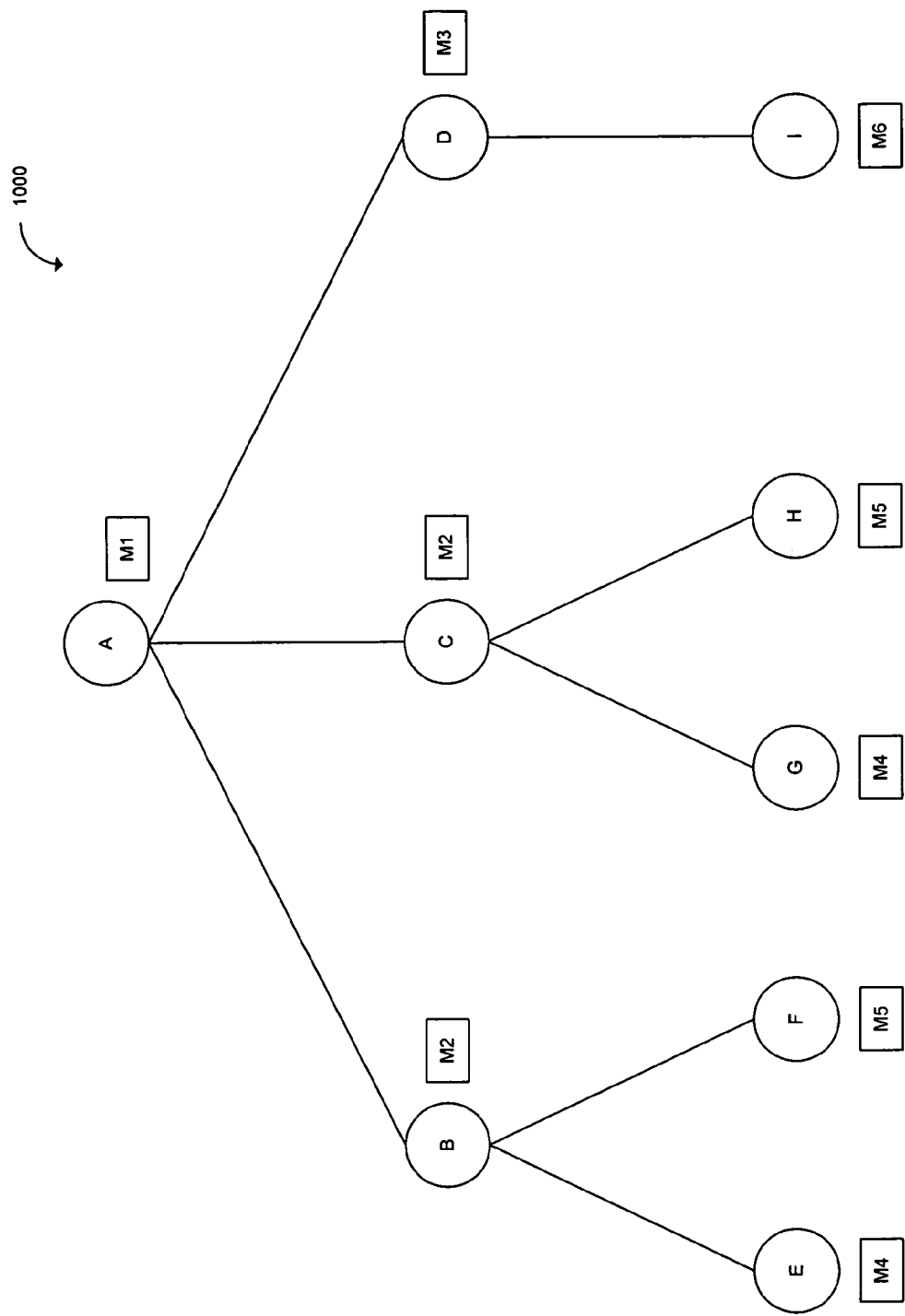
FIGS. 10–14 illustrate various integrated circuit design hierarchy trees.

FIG. 4 illustrates one method of partitioning an integrated circuit design. In the first step, one or more modules in the design are identified (402). Once all of the modules have been identified, a separate partition is defined for each module (404). Thus, the total number of partitions is equal to the total number of modules in the design. Referring to FIG. 10, design hierarchy tree 1000 is illustrated. Each node of design hierarchy tree 1000 is a module instance. Since there are six modules, M1–M6, six separate partitions will be defined. In an embodiment, each partition includes only one instance of a module. For example, since E and G are both instances of module M4, the partition for module M4 includes either instances E or G.

Figure 5:
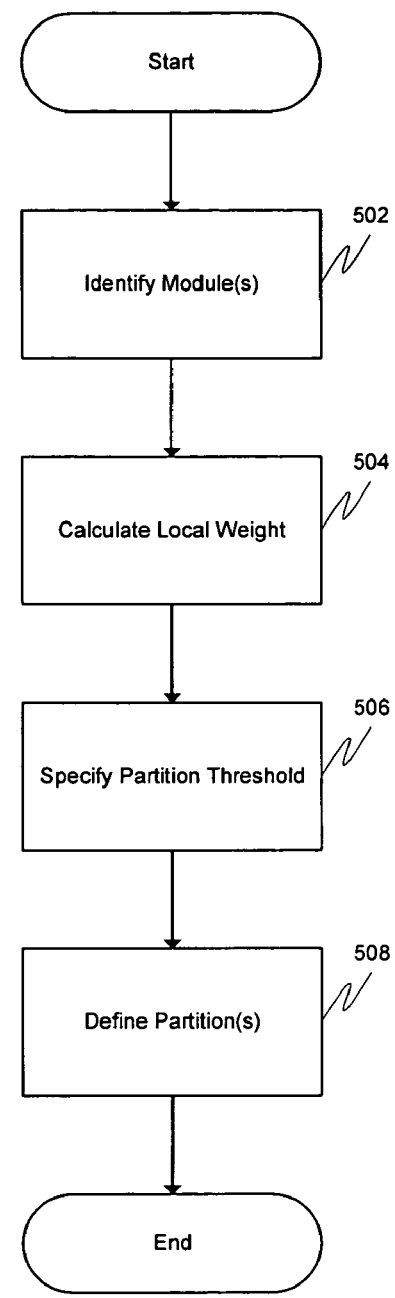
FIG. 5 is a flow diagram showing a process for partitioning an integrated circuit design at the granularity of modules according to an alternative embodiment of the present invention.

FIG. 5 illustrates another method of partitioning an integrated circuit design at the granularity of modules in which more than one module may be packed into a single partition. At step 502, one or more modules of the design are identified. A local weight for each module is calculated at step 504. A weight can be any syntactic measure that reflects the cost of verifying a design in terms of time and memory. In one embodiment, the weight ignores combinational elements in the design. In an alternative embodiment, the weight is a function of sequential and combinational elements in the design. Since sequential variables are associated with memory and combinational variables are associated with logic, sequential variables are more strongly related to cost. Thus, if the cost of four combinational variables is equal to the cost of one sequential variable, then weight=$S+\frac{1}{4}C$ if the weight is defined in terms of sequential variables. Any synthesis tool may be used to ascertain the number of sequential and combinational variables in the design.

Since a partition may comprise more than one module, the size of a partition is limited to a specified partition threshold (506) unless the local weight of a module is greater than the partition threshold. In that case, a partition is defined to be that single module. The partition threshold is specified in the same unit of measure as the weight and should be of a size that can be verified in an efficient manner. The system used to verify the design affects the efficiency of the verification. For example, past experiences have shown that the COSPAN (Coordination Specification Analysis) engine, which is a well established verification system developed at Bell Laboratories in the mid-1980s, can very quickly deal with partitions with 40–50 sequential variables.

Figure 11:
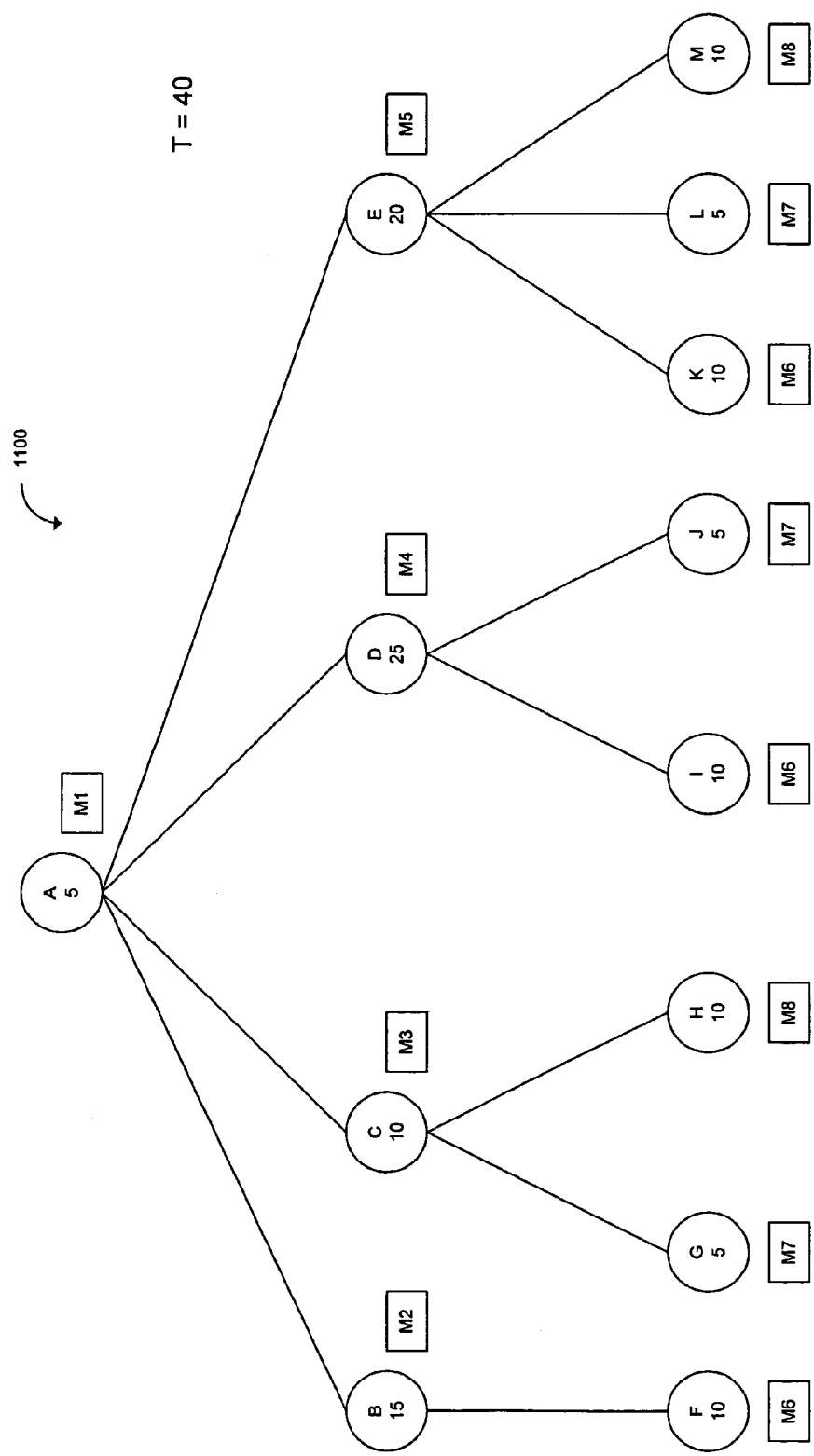

Finally, one or more partitions are defined (508). Referring to FIG. 11, design hierarchy tree 1100 is illustrated. There are eight modules, M1–M8, and thirteen module instances, A–M. The weight of each module instance has been calculated. A partition threshold (T) of 40 is specified. In the embodiment, the local weight of a module is equal to the weight of a single instance of the module. Thus, the local weight of module M1 is 5, the local weight of module M2 is 15, the local weight of module M3 is 10, the local weight of module M4 is 25, the local weight of module M5 is 20, the local weight of module M6 is 10, the local weight of module M7 is 5, and the local weight of module M8 is 10. In one embodiment, each module is defined in only one partition. In an embodiment, no more than one instance of the module is included in a partition. In one embodiment, the design is partitioned such that there are no significant disparities between each partition's weight. For example, four partitions {M1, M6, M8}, {M2, M3}, {M4}, and {M5, M7} with equal weights of 25 can be defined. Alternatively, the design is partitioned such that a minimum number of partitions are defined. For example, three partitions {M1, M5, M6, M7}, {M2, M4}, and {M3, M8} instead of four can be defined.

Figure 6:
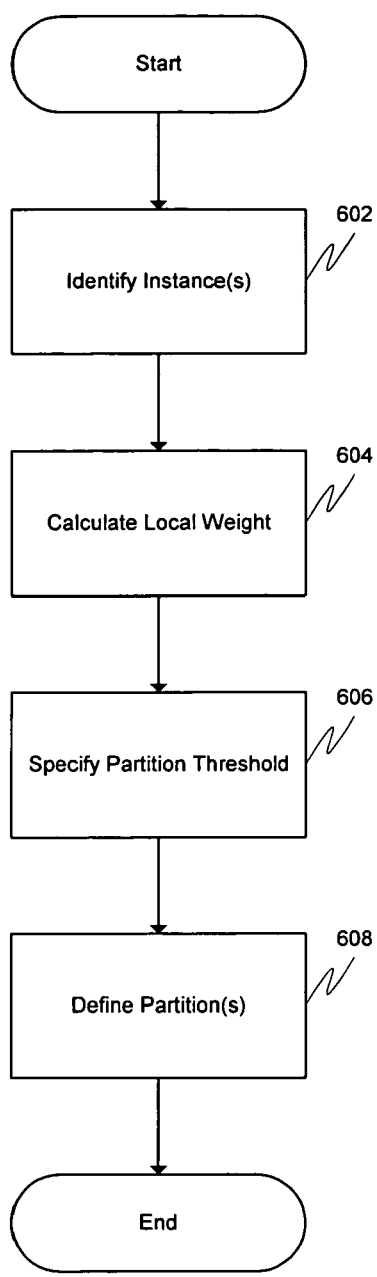
FIG. 6 is a flow diagram showing a process for partitioning an integrated circuit design at the granularity of instances according to one embodiment of the present invention.

FIG. 6 illustrates a method of partitioning an integrated circuit design at the granularity of module instances. First, one or more instances in the design are identified (602). Next, a local weight for each instance is calculated (604). A partition threshold is then specified (606). Finally, one or more partitions are defined (608).

Figure 12:
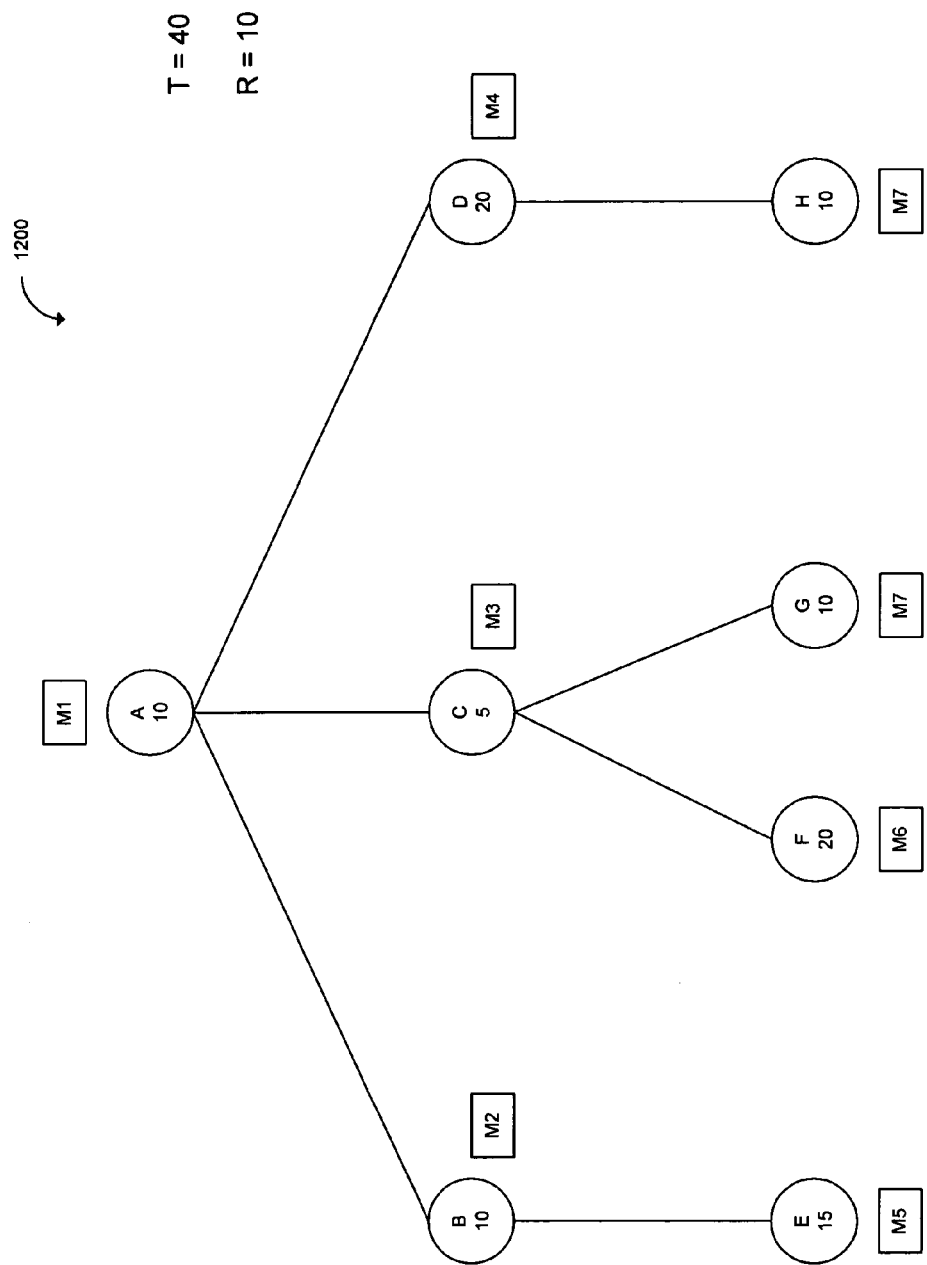

Referring to FIG. 12, a design hierarchy tree 1200 with seven modules, M1–M7, and eight instances, A–H, is illustrated. The local weight of each instance has been calculated and a partition threshold has been specified. In an embodiment, no instance is defined in more than one partition. In one embodiment, the design is partitioned such that as much coherence as possible is preserved, i.e., each partition is a contiguous portion of the tree defined by a root. For example, three partitions {A,D,H}, {B,E}, and {C,F,G} can be defined. Instances A, B, and C are the roots of the three partitions. In another embodiment, the design is partitioned such that there are no significant disparities between each partition's weight. For example, instead of the partitions weighing 40, 35, and 30, the design can be partitioned into {A,B,E}, {C,F,G}, and {D,H}, weighing 35, 35, and 30, respectively. In an alternative embodiment, no module is defined in more than one partition. For example, since instances G and H are instantiated from the same module M7, only one of the instances need to be included in a partition.

Figure 7:
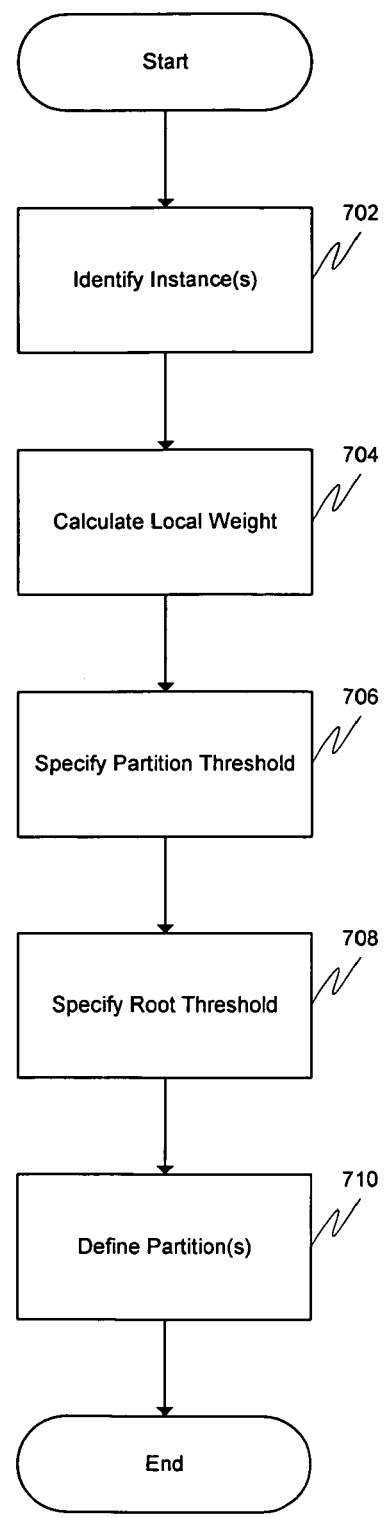
FIG. 7 is a flow diagram showing a process for partitioning an integrated circuit design at the granularity of instances according to another embodiment of the present invention.

FIG. 7 illustrates an alternative method of partitioning an integrated circuit design at the granularity of instances. In this method, in addition to the steps discussed above, a root threshold is specified (706). In one embodiment, if the local weight of an instance is less than or equal to the root threshold, then that instance may be the root of more than one partition. This modification introduces an overlap between partitions, but it is considered a good trade-off to avoid light-weight partitions, introduce more context, and thus reduce false negatives. Referring to FIG. 12, a root threshold R has been specified. In design hierarchy tree 1200, instances A, B, C, G, and H can be the root of more than one partition since the weight of each of those instances is less than or equal to the root threshold. For example, the design can be partitioned into {A,B,E}, {C,F,G}, and {A,D, H}, where instance A is the root of two partitions.

Figure 8:
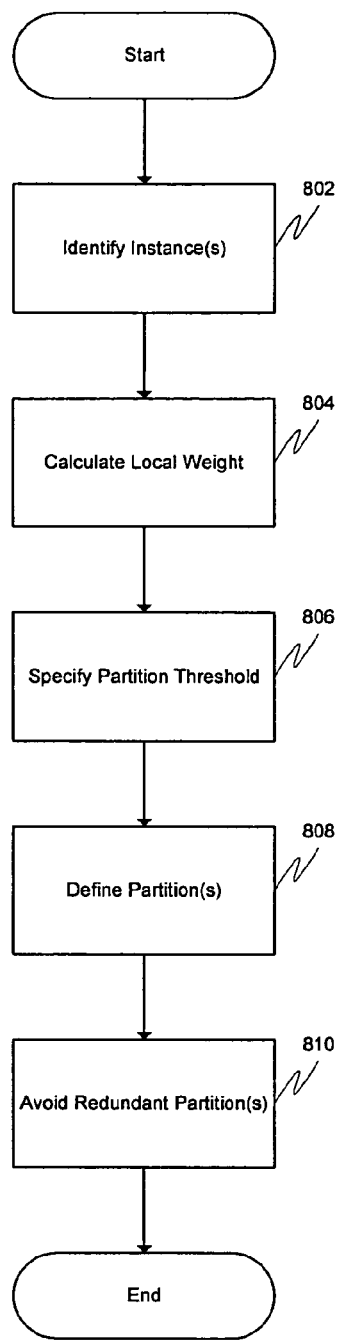
FIG. 8 is a flow diagram showing a process for partitioning an integrated circuit design at the granularity of instances according to a further embodiment of the present invention.

FIG. 8 illustrates another method of partitioning an integrated circuit design at the granularity of instances. In this method, in addition to the steps discussed in reference to FIG. 6, redundant partitions are avoided (810). In one embodiment, redundant partitions are avoided by not processing a portion of the design hierarchy tree, i.e., a sub-tree, when the root of the sub-tree is instantiated from the same module as the root of a previously defined module. For example, the sub-trees rooted at B and C in design hierarchy tree 1000 in FIG. 10 are both instantiated from the same module M2. Thus, only one of the sub-trees need to be processed into partitions.

In another embodiment, a partition table is maintained for the design hierarchy tree. In the embodiment, only the partitions in the partition table are verified. When a new partition is defined, it is added to the partition table if it is not equal to an existing partition in the partition table. Two partitions are equal if the roots of the partition are instantiated from the same module, and if there are one or more children, the children of the two partitions are instantiated from the same modules.

Pseudo-code for an embodiment of the method is set forth below. bottom-up( ) is the recursive procedure that is initially called with vertex (node) set to the root of a design hierarchy tree, a partitionThreshold and an empty partitionTable. The first two lines of the pseudo-code are initializations. The for loop is the recursive call in the DFS (Depth First Search). A child is recurred upon only if another instance of the same module doesn't already appear in the partitionTable. This saves processing of entire sub-trees. After processing each child, its partition Weight is added to the partition Weight of the current vertex unless it is designated as the root of a partition in the partitionTable. The partition weight of a leaf of a design hierarchy tree, i.e., a node without any children, is equal to the local weight of the node.

The next if statement followed by the while loop decides the children to be designated as partitions until the partitionWeight of this vertex falls below the partition Threshold. With each child that is designated as a partition, the freeList and the partitionWeight of it's parent are updated, unless another instance of the same module already exists in the partitionTable. The freelist of a vertex is a set of sub-trees rooted at the vertex that are not defined in the same partition as the vertex. The final add statement updates the freeList of the current node with the freeLists of the remaining children (indicating their boundaries).

```
bottom-up(vertex, partitionThreshold, partitionTable)
    initialize freeList(vertex)=( )
    partitionWeight(vertex)=localWeight(vertex)
    // process children
    for each child of vertex
        if (module(child) not in partitionTable)
            partitionTable =
                bottom-up (child, partitionThreshold, partitionTable);
        if (module(child) in partitionTable)
            add child to freeList(vertex);
        else.
            partitionWeight(vertex) += partitionWeight(child)
        end for
    // process this vertex,
    // remove children until partitionWeight <= partitionThreshold
    if (partitionWeight(vertex) > partitionThreshold)
        childList = order children(vertex) not appearing in
                    freeList(vertex) in descending order of
                    partitionWeight
        while (partitionWeight(vertex) > partitionThreshold) &&
                (childList is not empty)
            first = first element of childList;
            remove first in childList;
            if (module(child) not in partitionTable)
                insert in partitionTable (module (first),
                        freeList(first), partitionWeight(first))
                add first to freeList(vertex)
                partitionWeight(vertex) -= partitionWeight(first)
        end while
        if (partitionWeight(vertex) > partitionThreshold)
            insert in partitionTable (module(vertex),
                    freeList(vertex), local Weight(vertex))
    end if
    add freeLists of children(vertex) not appearing in
            freeList(vertex) to freeList(vertex);
    return partitionTable;
end bottom-up
```

Figure 13:
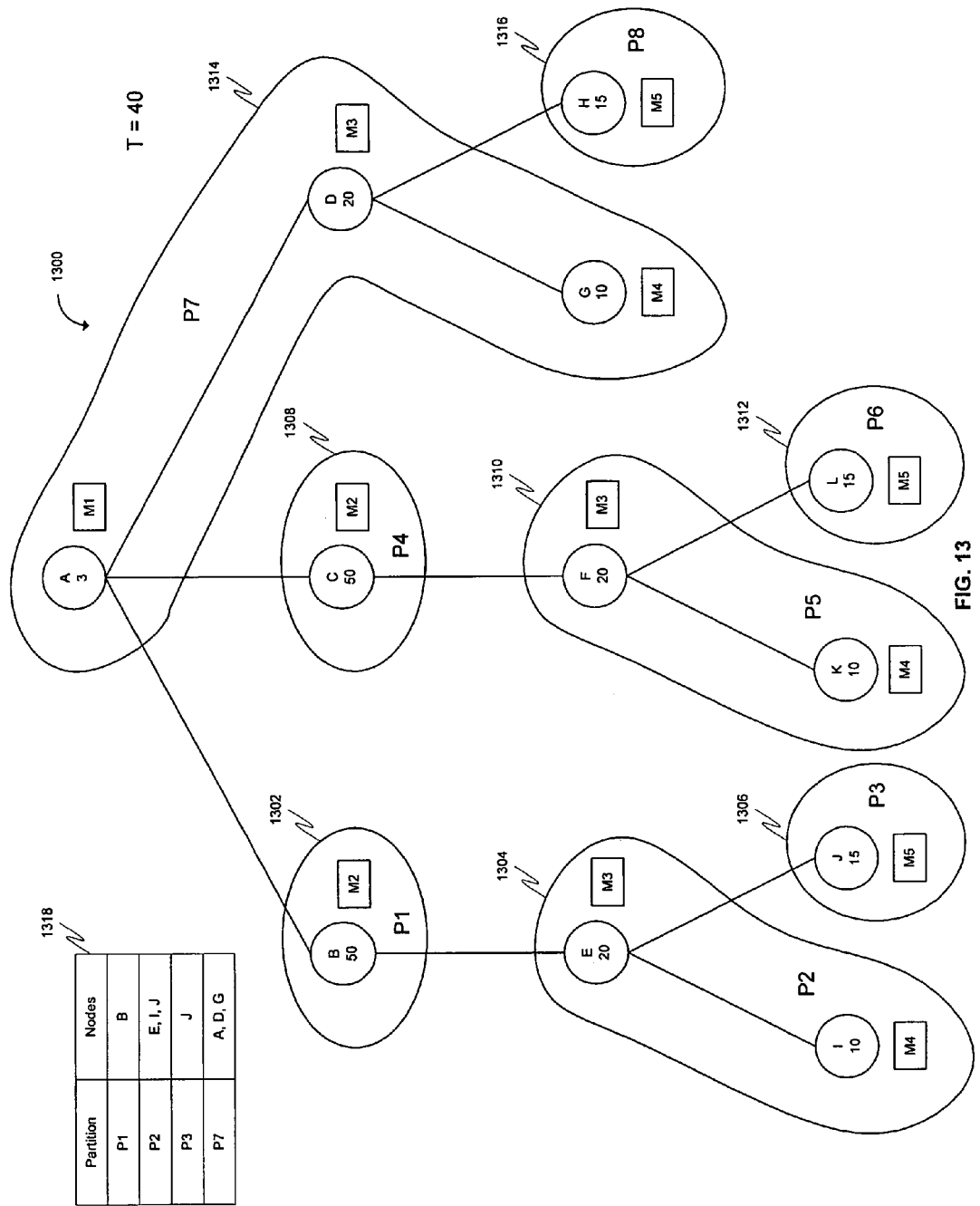

Referring to FIG. 13, design hierarchy tree 1300 has been partitioned using the above pseudo-code. In the embodiment, only partitions 1302, 1304, 1306, and 1314 are included in partition table 1318 because partition 1308 is equal to partition 1302, partition 1310 is equal to partition 1304, and partitions partition 1312 and 1316 are equal to partition 1306.

Pseudo-code for another embodiment of the method is set forth below. In the embodiment, a freelist is a list of pathnames of nodes to be freed. A partition is defined as a pair containing the root of the partition and a freelist containing a list of nodes in the subtree of the root of the partition that should be freed.

Given a partition, every path name in its freelist contains the root path name as its prefix, because every node represented in the freelist is a descendent of the partition root. In the embodiment, two partitions are regarded as identical if the following two conditions hold:

1. The roots of the partitions are of the same proctype.
2. The freelists are identical after the respective root path names are removed as prefixes from the path names in the corresponding freelists.

An example of a computer program listing is provided herein at the end of the detailed description.

EXAMPLE

For example, if procs .a and .e are of the same proctype, then the partition (root=.a, freelist={.a.b, .a.c.d}) is identical to (root=.e, freelist={.e.b, .e.c.d}).

```
// Main algorithm: partition
// Input:
// root, the root of a design hierarchy tree, the nodes of
// which corresponds to module instantiations in the design.
// Each node in the tree is referred to by its relative pathname.
// Interchange: expanded IP file.
// T is the given threshold for the weight of a single partition.
// R is the threshold to decide if root gets packed with each set of children
// assume R < T
// Output:
// Partitions are represented by the root of the subtree and the freelist
// (list of subtrees to be free in the hierarchy). The weight of the partition
// is also provided.
// Other variables:
// partition-table: all proctypes of nodes that form roots of
// partitions are put into partition-table to avoid inserting
// duplicates in the table.
partition(root, T, R) {
```

-continued

```
        assert (R < T);
        partition-table = empty(table); //initialize to empty table
        bottom-up (root, T, partition-table, R);
        if (makeFree(root) == false) {
            insert(proctype(root), root, freelist(root), part-weight(root))
                in partition-table;
        }
        print (node, freelist, part-weight) for each entry in partition-table;
}
// bottom-up: Computes cumulative weights under sub-tress and partitions
// simultaneously.
// Each node has the following attributes:
// proctype, weight, cum-weight (weight of all the nodes in the subtree
// rooted at this node), makeFree (field that contains the information whether the
// root should be freed or not) and part-weight (weight of partition if the partition
// were rooted at this node)
// part-weight is the cumulative weight of the subtree rooted at any node
// less the cumulative weight of partitions identified in this subtree.
// part-weight is not valid of nodes that form the root of multiple partitions.
// freelist is a list of procs, built bottom-up, valid for every child
// that is not in the partition-table or was inserted by its parent.
// makeFree is an attribute of a node that is defined above,
// indicating that the node that has been recurred on should be freed.
bottom-up(root, T, partition-table, R) {
        //initialize
        freelist(root) = ( );
        makeFree(root) = false; // should be initialized to not true
        part-weight(root) = weight(root);
        cum-weight(root) = weight(root); // compute the weight of the partition if it
were rooted at this node
        // process the children
        for each child in children(root) {
        // avoid recursion if proctype(child) in partition-table
        node = root that corresponds to proctype(child) in partition-table;
        if (proctype(child) in partition-table and makeFree(node) != true) {
                // freelist of this child is the freelist in the partition-table with the node-name
substituted by
                // the root name. Freelist is unique since makeFree is false.
                freelist(child) = substitute root-name for node-name in the freelist of
                                                        proctype(child) in partition-
table;
                part-weight(child) = part-weight value of proctype(child) in partition-table;
                cum-weight(root) += cum-weight(root value of proctype(child) in partition-
table);
                part-weight(root) += part-weight(child);
        } else if (proctype(child) not in partition-table) { // recur on each child
            bottom-up (child, T, partition-table, R);
            if (makeFree(child) != true) { // child wasn't included in any partition
                    assert(part-weight(child) <= T);
                    part-weight(root) += part-weight(child);
                    cum-weight(root) += cum-weight(child);
            }
            node = child;
        }
            if (makeFree(node) == true) { // child went into some partition, either now or
before
            assert(proctype(node) in partition-table);
            // uniquifying proctypes here, do not recur on this child.
            freelist(root) = union(child, freelist(root)); // ignore this subtree altogether
            children(root) = children(root) \ child; // ignore this child for packing into a
partition
            cum-weight(root) += cum-weight(root value of proctype(node) in partition-
table); // set the weight
            }
        }
        // decide the partitions
        // if part-weight exceeds threshold and weight(root) < R, set partitions using bin
packing
        // if root does not get included in any bin, return its correct freelist to the parent.
        if (part-weight(root) > T and weight(root) <= R) {
            {C_i} = bin_pack(children(root), T-weight(root)); // uses part-weight of the
children to pack
        // bin-pack returns the empty set if children(root) is empty
        // pack the children with the root and insert into the partition table
            for each C_i in {C_i} {
            if (compute-part-weight(C_i) > (T-weight(root))) {
                    assert(number-elements(C_i) == 1);
                    // Partition table invariant: case 4
                    if (proctype(c in C_i) not in partition-table) { // child may exist in partition-
```

-continued

```
table
                    insert (proctype(c in C__i), c in C__i, freelist(c in C__i),
                            compute-part-weight(C__i)) in partition-table;
                    assert(c in C__i not in its freelist(c in C__i));
            }
            makeFree(c in C__i) = false;
        } else {
            // for this partition, remove the other children of the root and
            // union the freelist of children in C__i (boundaries of current partition)
            tempfreelist = union((children(root) \ C__i), freelist(c in C__i),
                            freelist(root));
            // insert root and bin into partition-table
            insert (proctype(root), root, tempfreelist,
                    weight(root)+ sum(part-weight({c in C__i}))) in partition-table;
            assert(root not in tempfreelist) for each node in partition-table;
            // indicate to the parent that this node should be freed: case 1
            makeFree(root) == true;
        }
        part-weight(root) -= sum(part-weight({c in C__i}));
        }
        assert(part-weight(root) == weight(root));
        if (makeFree(root) != true) {
        freelist(root) = union(children of root, freelist(root));
        }
        return;
    }
    // if root can't be included in the partition, set some children as partitions
    while (part-weight(root) > T) {
    if (children(root) not empty) {
        // update cumulative weight for the next partition
        part-weight(root) -= weight of max-weight-child; // this can be varied
        // free the max-weight-child in the partition that the root belongs to
        freelist(root) = union(max-weight-child, freelist(root));
        children(root) = children(root) \ max-weight-child;
        //Insert max-weight-child into the partition table: case 3
        if (proctype(max-weight-child) not in partition-table)
                insert (proctype(max-weight-child), max-weight-child,
                        freelist(max-weight-child),
                        part-weight(max-weight-child)) in partition-table;
                assert(max-weight-child not in freelist(max-weight-child));
                makeFree(max-weight-child) = false;
    } else { // no children are left, weight(root) > T, designate it as a partition
                assert(part-weight(root) == weight(root));
                assert (proctype(root) not in partition-table);
                insert (proctype(root), root, freelist(root),
                        part-weight(root)) in partition-table;
                assert(root not in freelist(root)) for each node in partition-table;
                // indicate to the parent that this node should be freed: case 2
                makeFree(root) = true;
                return;
        }
    }
    // add to the freelist of this node those of the children
    freelist(root) = union({freelist(each child in children(root))}, freelist(root));
    assert(part-weight(root) == weight(root) + sum(part-weight({child in
    children(root)})));
    return;
}
```

Figure 9:
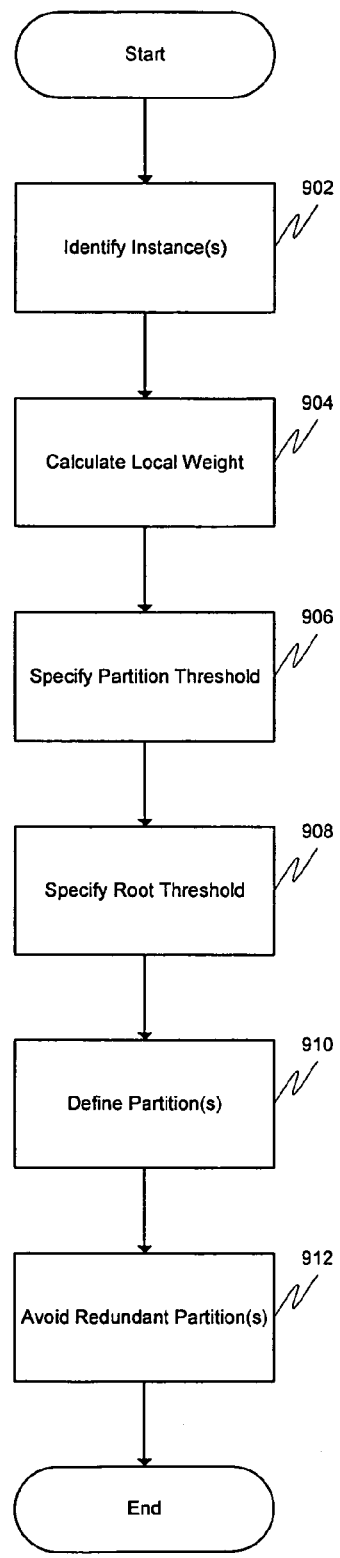
FIG. 9 is a flow diagram showing a process for partitioning an integrated circuit design at the granularity of instances according to an alternative embodiment of the present invention.
Figure 14:
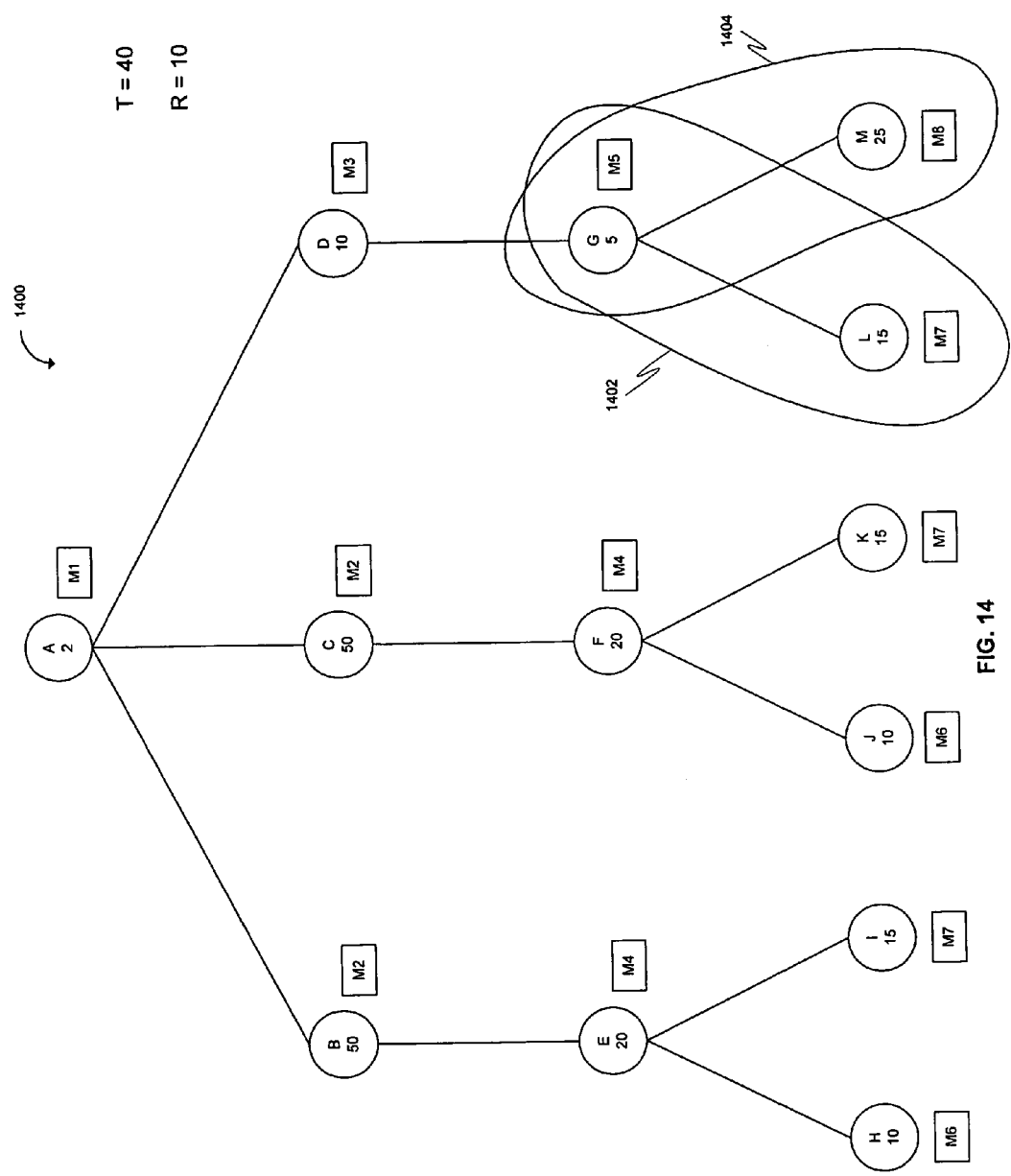

FIG. 9 illustrates a further method of partitioning an integrated circuit design at the granularity of instances. In this method, in addition to the steps discussed in reference to FIG. 8, a root threshold is specified (908). In one embodiment, if the local weight of an instance is less than or equal to the root threshold, then that instance may be the root of more than one partition. In an embodiment, the children of the instance are packed into bins. The bin threshold is the difference between the partition threshold and the local weight of root. Each bin contains one or more children. If the local weight of a child is above the bin threshold, that child is packed into its own bin. For each bin, a partition is defined combining the root and the one or more children in the bin. For example, in FIG. 14, since instance G's weight is less than the root threshold of 10, it can be the root of one or more partitions. L and M are packed into separate bins because the combined weight of L and M is 40, which is above the bin threshold of 40−5=35. L is then combined with G into partition 1402 and M is combined with G into partition 1404.

Figure 1B:
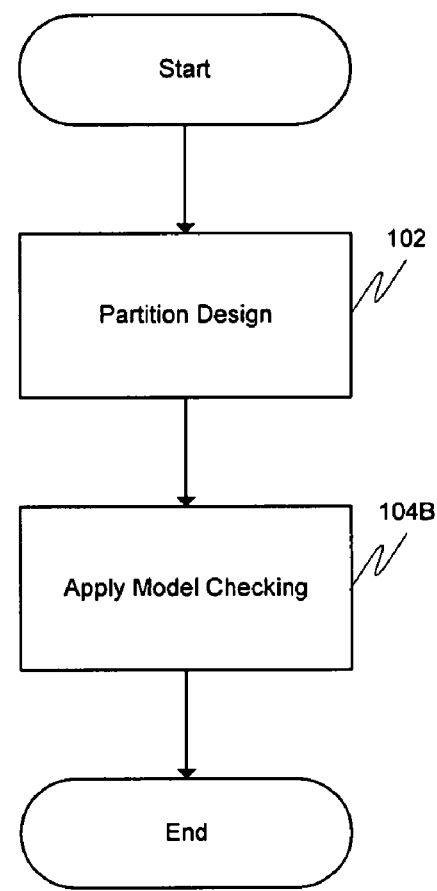
FIG. 1B depicts a high-level process flow chart of another embodiment of the present invention.

Referring to FIG. 1A, after the design has been partitioned, each partition is verified (104A). In the embodiment of FIG. 1B, model checking is applied to one or more local properties of each partition (104B). The local properties checked may be built-in, user-defined, or both. In one embodiment, built-in properties of a partition are automatically identified. If no violations are found for any of the properties verified, then the design does not have any such violations.

Figure 2:
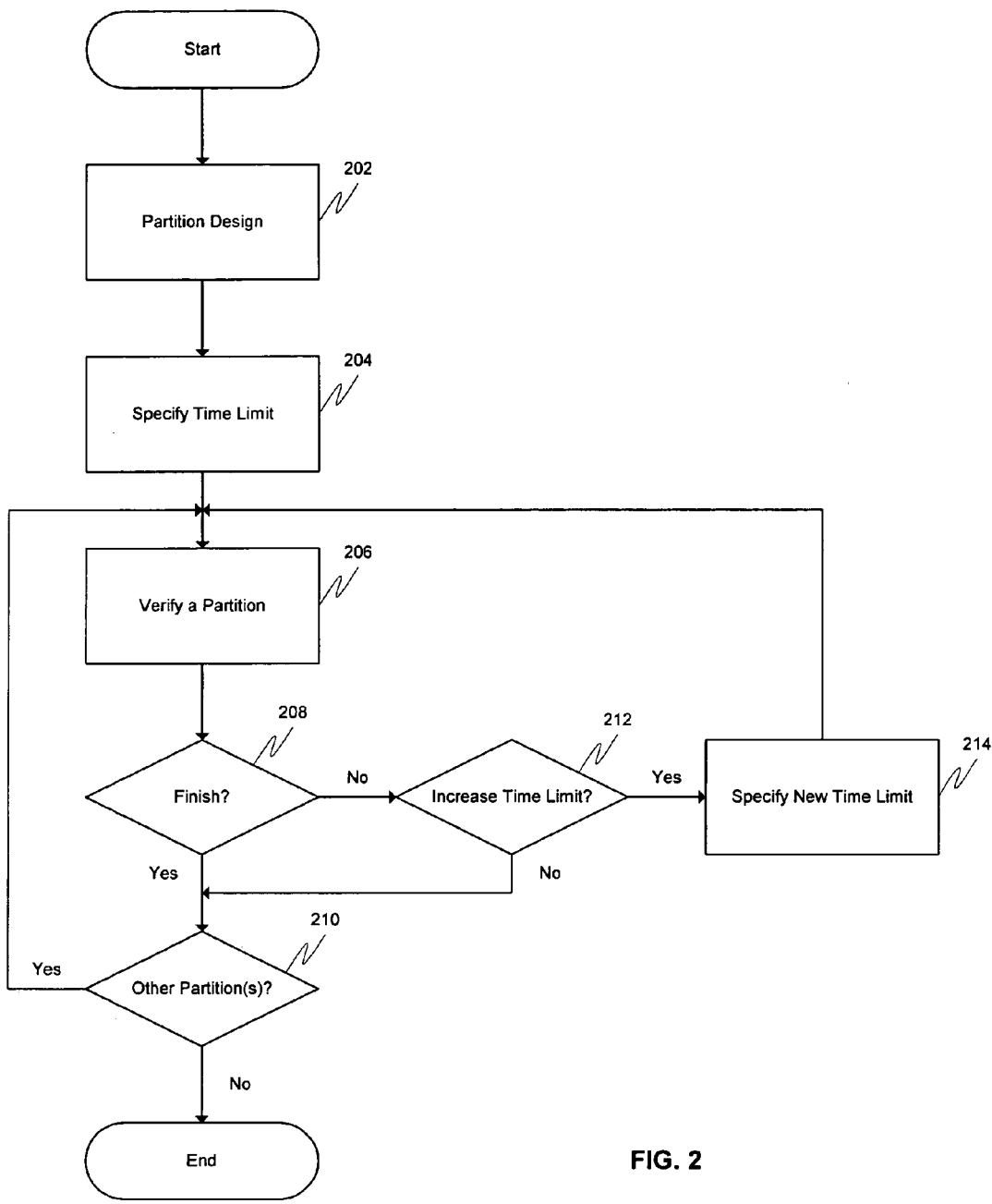
FIG. 2 is a flow diagram showing a process for verifying an integrated circuit design according to one embodiment of the present invention.

FIG. 2 illustrates another embodiment of the invention. In this embodiment, a time limit for verifying each partition is specified (204). Verification of a partition will be terminated if it is not finished within the specified time limit. If verification is completed (208), the process continues onto step 210 to determine whether there are any other partitions to verify. If there are no other partitions, the process ends. If there are one or more partitions yet to be verified, the process returns to step 206 where another partition is verified. If verification is not completed (208), the time limit can be increased. If no increase is desired (212), the process skips to step 210. On the other hand, if a time limit increase is desired (212), a new time limit is specified at step 214. The process then returns to step 206 to re-verify the partition.

Figure 3:
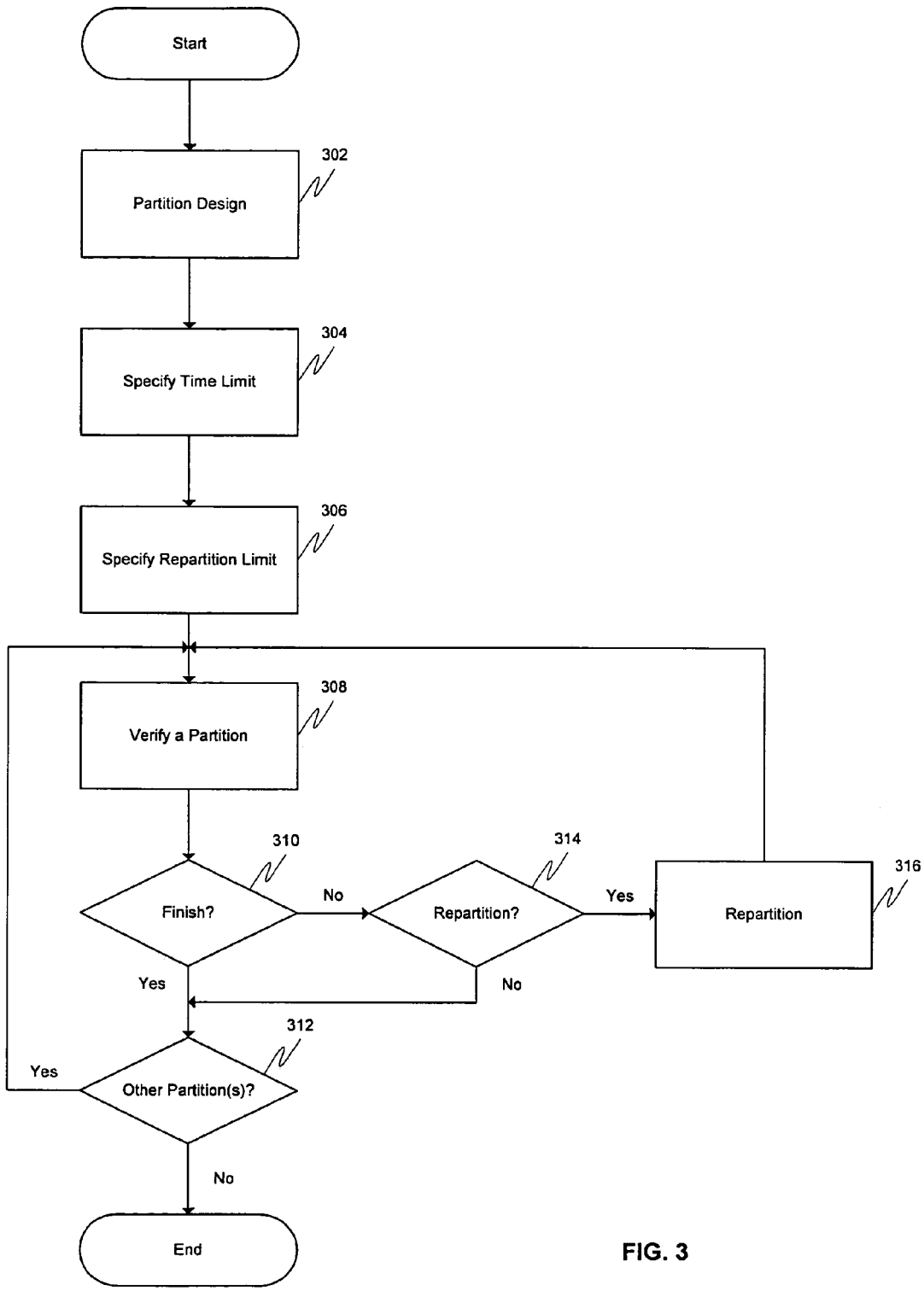
FIG. 3 is a flow diagram showing a process for verifying an integrated circuit design according to another embodiment of the present invention.

FIG. 3 illustrates a further embodiment of the invention. In this embodiment, in addition to specifying a time limit (304), a repartition limit is also specified (306). If verification is completed (310), the process continues onto step 312 to determine if there are any other partitions to verify. If there are no other partitions, the process ends. If there are one or more partitions yet to be verified, the process returns to step 308 where another partition is verified. If verification is not completed (310), the partition may be repartitioned into smaller pieces. In an embodiment, a module or instance is not subdivided into multiple partitions. If the partition cannot be partitioned further or if no repartition is desired (314), the process jumps to step 312. Conversely, if repartition is desired and the partition can be partitioned further (314), the partition is repartitioned at step 316. In one embodiment, the repartitioning step comprises lowering the partition threshold. In an embodiment, the partition threshold is halved each time a partition is repartitioned. The process then returns to step 308 to verify the new partitions.

Figure 15:
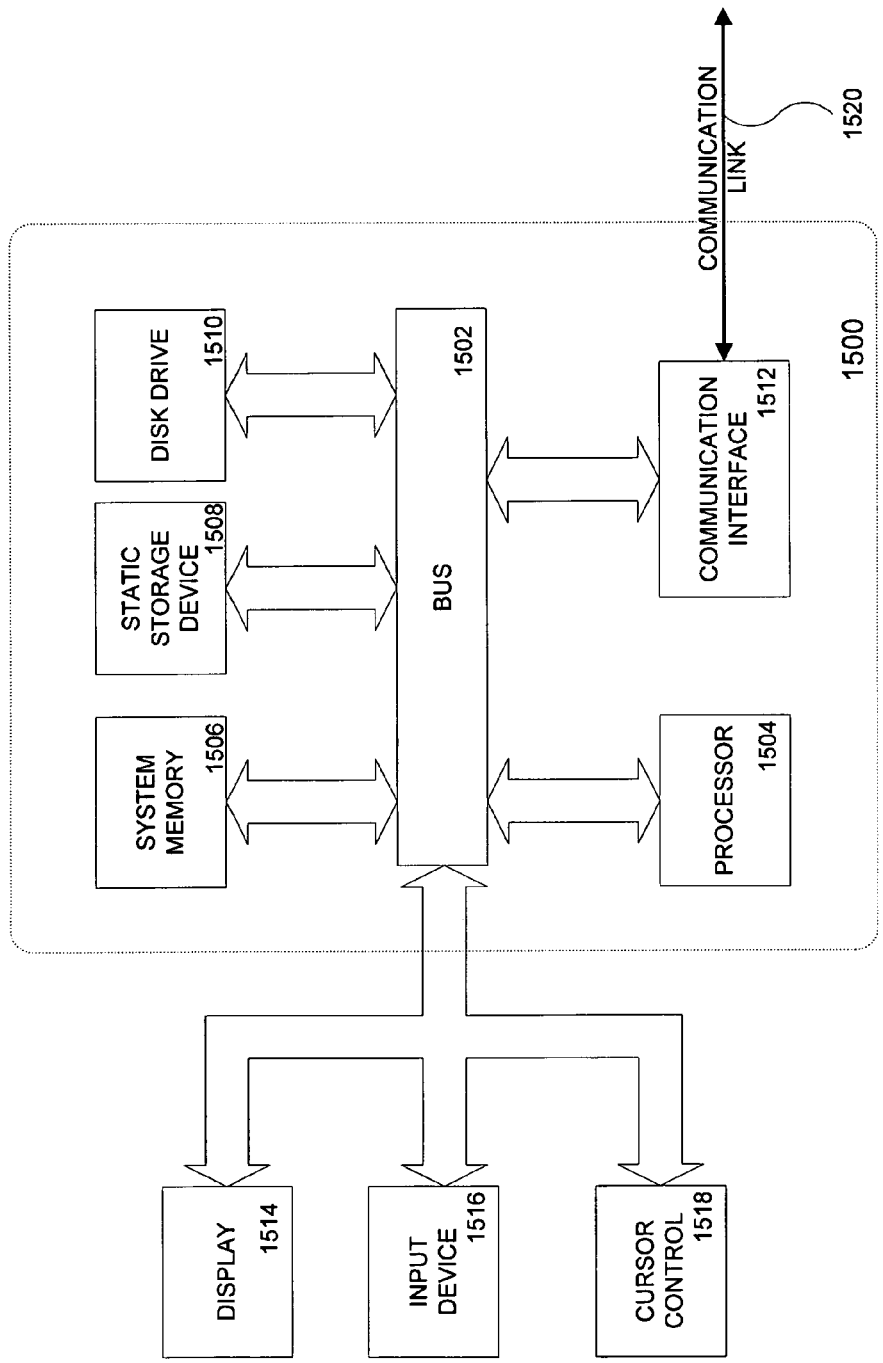
FIG. 15 is a diagram of a computer hardware system with which the present invention can be implemented.

FIG. 15 is a block diagram of a computer system 1500 suitable for implementing an embodiment of the present invention. Computer system 1500 includes a bus 1502 or other communication mechanism for communicating information, which interconnects subsystems and devices, such as processor 1504, system memory 1506 (e.g., RAM), static storage device 1508 (e.g., ROM), disk drive 1510 (e.g., magnetic or optical), communication interface 1512 (e.g., modem or ethernet card), display 1514 (e.g., CRT or LCD), input device 1516 (e.g., keyboard), and cursor control 1518 (e.g., mouse or trackball).

According to one embodiment of the invention, computer system 1500 performs specific operations by processor 1504 executing one or more sequences of one or more instructions contained in system memory 1506. Such instructions may be read into system memory 1506 from another computer readable medium, such as static storage device 1508 or disk drive 1510. In alternative embodiments, hard-wired circuitry may be used in place of or in combination with software instructions to implement the invention.

The term "computer readable medium" as used herein refers to any medium that participates in providing instructions to processor 1504 for execution. Such a medium may take many forms, including but not limited to, non-volatile media, volatile media, and transmission media. Non-volatile media includes, for example, optical or magnetic disks, such as disk drive 1510. Volatile media includes dynamic memory, such as system memory 1506. Transmission media includes coaxial cables, copper wire, and fiber optics, including wires that comprise bus 1502. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1500. According to other embodiments of the invention, two or more computer systems 1500 coupled by communication link 1520 (e.g., LAN, PTSN, or wireless network) may perform the sequence of instructions required to practice the invention in coordination with one another.

Computer system 1500 may transmit and receive messages, data, and instructions, including program, i.e., application code, through communication link 1520 and communication interface 1512. Received program code may be executed by processor 1504 as it is received, and/or stored in disk drive 1510, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. Additionally, although presently capacity is not an issue for simulation of designs, it is foreseeable that in the future circuit designs may be of a size that cannot be handled by a simulator as a whole. Thus, the method and system for verifying integrated circuit designs through partitioning disclosed herein may be applicable to simulation. The specification and drawings are, accordingly, to be regarded in an illustrative rather than restrictive sense.

The invention claimed is:

1. A method for partitioning an integrated circuit design, comprising:
    identifying one or more modules in said integrated circuit design;
    calculating a local weight for each module in said integrated circuit design;
    specifying a partition threshold; and
    defining one or more partitions, each partition comprising one or more modules and each partition having a partition weight, said partition weight derived based upon the local weight of said one or more modules in said partition, wherein a partition weight is less than or equal to said partition threshold when said partition comprises more than one module.

2. The method of claim 1 wherein the local weight of a module is a function of sequential and combinational elements in said module.

3. The method of claim 1 wherein the partition threshold has a size that is below a prescribed threshold.

4. The method of claim 1 wherein said one or more partitions are defined such that a minimum number of partitions are defined for said integrated circuit design.

5. The method of claim 1 wherein said one or more partitions are defined such that there are no significant disparities between the partition weight of said one or more partitions.

6. The method of claim 1 wherein a module comprises one or more functional components.

7. The method of claim 1 wherein each of the one or more modules is associated with one of the one or more partitions.

8. The method of claim 1 wherein each module comprises one or more instances and each partition comprises only one instance of each of said one or more modules.

9. The method of claim 1 wherein said one or more partitions overlap.

10. A method for partitioning an integrated circuit design, comprising:
    identifying one or more instances in said integrated circuit design;
    calculating a local weight for each instance in said integrated circuit design;
    specifying a partition threshold; and
    defining one or more partitions, each partition comprising one or more instances, one of said one or more instances being a root of said partition, each partition having a partition weight, said partition weight derived based upon the local weight of said one or more instances in said partition, wherein a partition weight is less than or equal to said partition threshold when said partition comprises more than one instance.

11. The method of claim 10 wherein the local weight of an instance is a function of sequential and combinational elements in said instance.

12. The method of claim 10 wherein the partition threshold has a size that is below a prescribed threshold.

13. The method of claim 10 wherein said one or more partitions are defined such that there are no significant disparities between the partition weight of said one or more partitions.

14. The method of claim 10 wherein said one or more partitions are defined such that a coherence is preserved.

15. The method of claim 10 further comprising specifying a root threshold, wherein an instance is the root of a single partition when the local weight of said instance is greater than said root threshold.

16. The method of claim 10 wherein each of the one or more instances is associated with one of the one or more partitions.

17. The method of claim 10, further comprising avoiding redundant partitions.

18. A system for partitioning an integrated circuit design, comprising:
    means for identifying one or more instances in said integrated circuit design, each instance being instantiated from a module in said integrated circuit design;
    means for calculating a local weight for each of said one or more instances in said integrated circuit design;
    means for specifying a partition threshold; and
    means for defining one or more partitions, each partition comprising one or more instances, one of said one or more instances being a root of said partition, each partition having a partition weight, said partition weight derived based upon the local weight of said one or more instances in said partition, wherein a partition weight is less than or equal to said partition threshold when said partition comprises more than one instance.

19. The system of claim 18 wherein the local weight of an instance is a function of sequential and combinational elements in said instance.

20. The system of claim 18 wherein the partition threshold has a size that is below a prescribed threshold.

21. The system of claim 18 wherein said one or more partitions are defined such that there are no significant disparities between the partition weight of said one or more partitions.

22. The system of claim 18 wherein said one or more partitions are defined such that a coherence is preserved.

23. The system of claim 18 further comprising specifying a root threshold, wherein an instance is the root of a single partition when the local weight of said instance is greater than said root threshold.

24. The system of claim 18 wherein each of the one or more instances is associated with one of the one or more partitions.

25. The system of claim 18, further comprising means for avoiding redundant partitions.

26. The system of claim 25 wherein said avoiding step comprises maintaining a partition table, wherein a newly defined partition is added to said partition table when said newly defined partition is not equal to an existing partition in said partition table.

* * * * *